US007238889B2

(12) United States Patent
Rivera

(10) Patent No.: US 7,238,889 B2
(45) Date of Patent: Jul. 3, 2007

(54) INTEGRATED CABLE MANAGEMENT STAY

(75) Inventor: Alexander F. Rivera, Edgewater, MD (US)

(73) Assignee: Dot Engineering Inc, Edgewater, MD (US)

(*) Notice: Subject to any disclaimer, the term of this patent is extended or adjusted under 35 U.S.C. 154(b) by 0 days.

(21) Appl. No.: 11/202,419

(22) Filed: Aug. 10, 2005

(65) Prior Publication Data

US 2007/0034400 A1 Feb. 15, 2007

(51) Int. Cl.
*H05K 3/30* (2006.01)

(52) U.S. Cl. ............................ 174/135; 174/DIG. 12; 174/138 G; 439/501

(58) Field of Classification Search ................ 174/135, 174/DIG. 12, 138 G; 439/501
See application file for complete search history.

(56) References Cited

U.S. PATENT DOCUMENTS 5,892,177 A * 4/1999 Mazaris ...................... 174/135
5,906,507 A * 5/1999 Howard ...................... 439/501
6,635,825 B2 * 10/2003 Adachi ..................... 174/72 A

* cited by examiner

*Primary Examiner*—Jinhee Lee
(74) *Attorney, Agent, or Firm*—Reed Smith LLP

(57) ABSTRACT

The present invention is a stay for retaining cables or other long, flexible structures in a coiled or bundled condition. The stay retains an end of the cable in an shape in which the end is wrapped around the coil or bundle when desired, such that a user of the cable can wrap the end of the cable around the coil or bundle and have the end retained in such position without having to knot the end to keep it wrapped around the cable or bundle. The stay may use a ductile or malleable element oriented along an end of the cable, such that the cable end to which the stay is affixed may be bent into a position in which the end is wrapped around a cable coil or bundle. The stay may use a helical form such that an end of a cable forms a helical shape, such that helical shape may be wrapped around a cable coil or bundle to retain the end around the coil or bundle. The stay may use a selectively engageable feature such as alternating hook and pile surfaces on the exterior of the stay to allow successive wraps to be retained against successive wraps.

4 Claims, 5 Drawing Sheets

INTEGRATED CABLE MANAGEMENT STAY

BACKGROUND

The present invention pertains generally to the organization and storage of flexible tubes and cables, and more particularly to devices for releasably constraining flexible tubes and cable together in a manner amenable to quick and easy storage and deployment.

The need to coil or bundle wires, cables, flexible tubes, ropes and hoses exists throughout industry and home life. Devices such as extension cords, cables, air hoses, ropes, and other long, flexible articles (hereinafter referred to generically as "cables") present a storage problem, where coiled cables often become tangled due to the lack of constraints to keep the cables properly coiled. The traditional storage method is to wrap the cables around a person's elbow and between the thumb and forefinger.

Once the cable has been coiled, some means for retaining the strap in the coiled condition may be necessary to prevent the coiled cable from uncoiling or becoming tangled. External devices for retaining the cable in a coiled condition include straps which surround the cable to prevent it from becoming unbundled. Such straps may take the form of wire ties, plastic wire ties, or cable straps having a feature to allow the strap to be closed around a bundle. While each of these devices solve the problem of the cable becoming unbundled to one degree or another, each has the problem that the bundling device is physically separate from the cable being bundled, and accordingly may be lost. When these devices are attached to a cable, the devices may create features which snag on objects if the feature is pulled past such an object. Additionally, separate cable bundling devices may also require two hands for operation, such that releasing a coiled or bundled cable in order to operate the tie could allow the cable to become uncoiled or unbundled.

Alternately, the end of the coiled or bundled cable could be tied around the coil or bundle to keep the coil or bundle from uncoiling. In order to keep the end in place, a knot would typically be formed in the end of the cable to allow the cable end to be retained around the coiled or bundled cables. Such knots, however, may become difficult to untie, especially if the knot becomes over-tightened.

SUMMARY OF THE INVENTION

The present invention creates an improvement in the management of cables or other long flexible articles, particularly when gathered for storage. The invention contemplates the inclusion of a feature to allow a cable or other long flexible article to be self retaining when wrapped around a cable or bundle formed from the cable or long flexible article.

The feature may include an element integrated with one or both ends of the cable or other long flexible article, such that when wrapped around a coil or bundle, the end retains itself in the wrapped condition. The feature may utilize a malleable element which allows the end of the cable or other long flexible article to be bent into a wrapped shape, while still allowing a user to unbend the end when the cable is in use. In an alternate embodiment, the feature may utilize a form, such as a helix, which allows the end of the cable or other long flexible article to be wrapped around a bundled or coiled cable or other long flexible article. In a still further variant, the feature may comprise the addition of an element to the outer surface of the cable or other long flexible article allowing one or more successive wraps of the cable or long flexible article to be retained in contact with the previous wrapping.

The present invention may be embodied in implementations which are fabricated internally to the cable or other long, flexible article, or in configurations which may be added by a user to a previously obtained cable or other long flexible article.

In one implementation which may be added to a previously owned cable, the feature may be a wrap formed from a web having malleable elements contained therein, such that the web may be wrapped around an end of a cable or other long flexible article to retain the malleable elements in an orientation parallel to a long axis of the cable or other long flexible article.

Alternately, the feature may be a cover which can be placed around an end of a cable or other long flexible article, or through which a cable or other long flexible article may be inserted.

DETAILED DESCRIPTION OF THE INVENTION

In order to provide a more full understanding of the present invention, a discussion of embodiments of the present invention is provided as follows, in which like reference numbers within the Figures indicate like elements.

Figure 1:
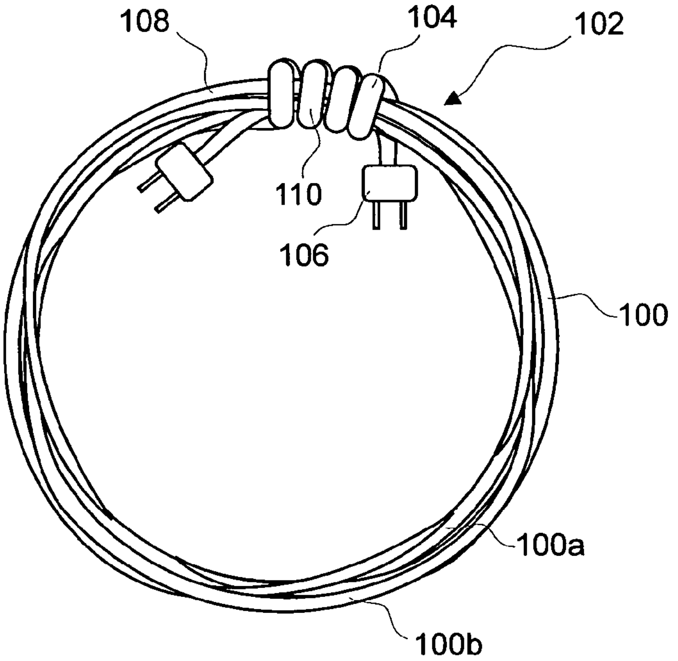
FIG. 1 illustrates a coiled cable having an integrated cable stay according to the present invention.

In FIG. 1, there is shown a cable 100 that has been coiled 102, and in which an integrated cable stay 104 has been utilized to retain the cable 100 in the coiled condition. As noted above, the term cable is used herein to refer to any long, flexible article which a user may desire to coil or bundle, and may include, but is not limited to ropes, strings, twine, electrical cords, cables, wires, and flexible tubes and hoses.

The coiled cable may include several bights 100*a*, 100*b*, . . . which have been coiled, such as by having been wound between a user's hand and elbow. A first end 106 of the cable may then be wound around the coiled cable 108 to prevent the coiled cable 108 from becoming uncoiled. In order to prevent the windings 110 from unwinding from around the coiled cable 108, the first end 106 may include a cable stay 104, such as a malleable element extending along a length of the cable 100 adjacent the first end 106 of the cable 100, such that when the first end 106 is wound around the cable 100, the malleable material is formed to remain in the wound condition, while also allowing the first cable end 106 to be straightened when the first cable end 106 is not wound around a bundled or coiled cable.

Figure 2:
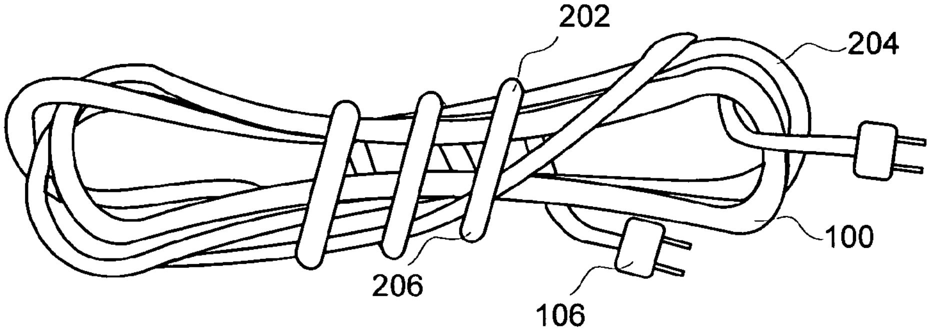
FIG. 2 illustrates a bundled cable having an integrated cable stay according to the present invention.

In FIG. 2, an alternate embodiment of an integrated stay is shown, using a resilient helical stay 202 to maintain the first cable end around a bundled section of cable 204. The term resilient is used herein to identify that the helical stay should not preferably be rigid, but rather allow some flexing to ease the winding of the helical stay portion around one or more bights of a bundled or coiled cable. The resilient helical stay 202 forms a spiral 206 around the bundled cable 204, such that the cable 100 does not readily become unbundled. The helical stay 202 may be applied around the bundled cable 204 by wrapping the helical stay portion around the bundled portion of cable 100.

Although the illustrations show a coiled cable being held by a malleable stay and a bundled cable held by a helical stay, either stay form may be used with either gathered, coiled or bundled cable, and no limitations are intended by the use of the particular types of stay in conjunction with coiled or bundled cables.

Figure 3:
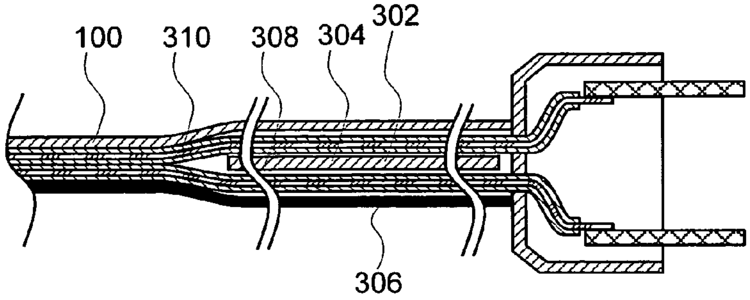
FIG. 3 illustrates a cable end in cross section having an internally integrated malleable stay.

In FIG. 3, a cable having an internally integrated malleable stay 302 is shown in cross section. The use of the malleable stay 302 allows the cable 100 to be in a straight position when unwrapped. As shown in FIG. 3, an internally integrated malleable stay 302 may be formed by placing a malleable strip 304 or wire, such as formed by a soft piece of metal (hereinafter referred to collectively as a "strip" 308), within the outer sheath 306 of the cable 100. The strip 308 may be coated, such as with an insulative material, to limit the potential for the strip 308 becoming a conductor within the cable 100. The outer sheath 306 may be used to contain one or more conductive elements 310 or load bearing elements. The strip 308 may have a length selected to allow a desired amount of self-retaining wraps around a coiled or bundled cable to be achieved. The cable may utilize a malleable strip 308 at one end only, or may utilize malleable strips at both ends.

One potential issue regarding the use of a stay in a wrapped section of coil relates to the deformation of the cable when bent. When a cable is bent into a circular path, such as when wound around a coiled or bundled portion of the cable, the outer boundary of the wound portion of cable may typically be at a larger radius than an inner boundary. The difference between the inner radius and the outer radius creates a difference in the lengths of the outer boundary and the inner boundary along the circular path. This difference in the lengths may create relative motion between components which comprise the cable, such as may occur if an outer edge of an outer sheath is stretched relative to a core of the cable. If the components of the cable are joined, i.e., not allowed to move relative to each other, high stresses may develop in one or more of the components, such that stress or plastic deformation related failures may become a concern.

In order to accommodate such relative motion, the components of the cable 100 may be integrated such that the individual components can slide relative to each other. In the case of an integrated malleable stay 302, the strip 308 may be enclosed within a tube structure (not shown) to protect wires or other conductive elements within the outer sheath 306 from abrasion damage from relative motion. The strip 308 itself may be slidable relative to the flexible tube structure and provided with radiused edges to limit the potential for the strip binding in the tube as a result of differential motion between the strip and the tube.

Figure 4:
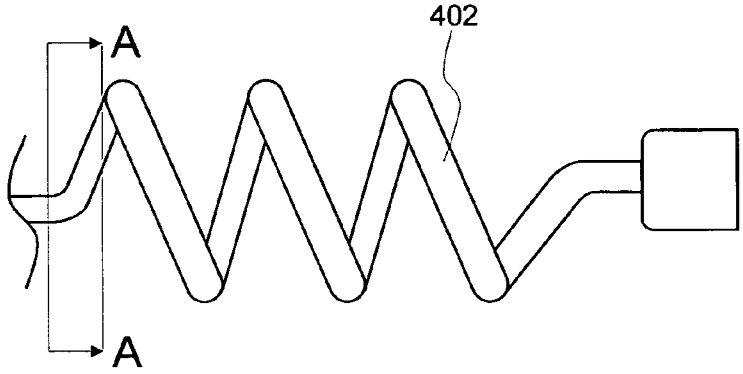
FIG. 4 illustrates a cable end having an internally integrated flexible spinal stay according to the present invention.

As shown in FIG. 4, the stay of the present invention may alternately be formed by integrating a resilient helical form along an end of a cable. The helical form may hold the cable end in a helical shape, such that the end of the cable may be wrapped around a coiled or bundled cable, with the helical shape inducing the end of the cable to be retained around the coil or bundle.

Figure 4A:
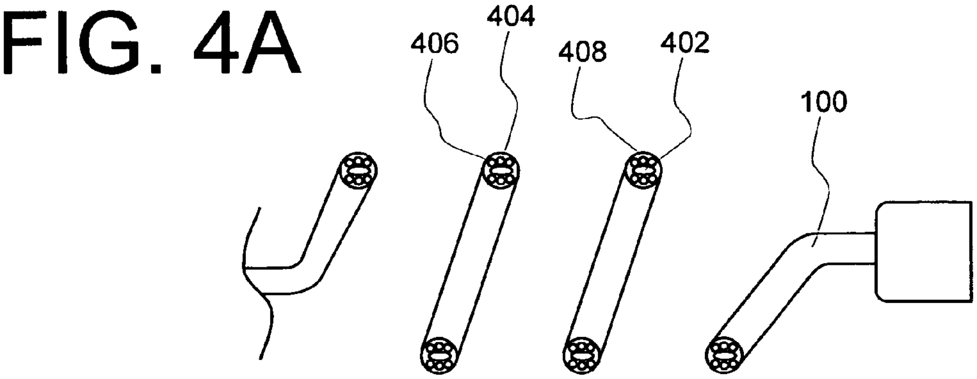
FIG. 4A illustrates the cable end of FIG. 4 in lengthwise cross section.

As shown in FIG. 4A, the resilient helical form 402 may be built into one end of a cable 100, such that conductive elements 404 and an outer sheath 406 may be formed around the resilient helical form 402. The helical form 402 may use a non-circular cross section to bias the flexibility of the stay in a preferred direction, as well as to provide pockets 408 within the outer sheath for conductive elements, thus allowing the outer sheath 406 to retain a generally circular cross section.

Figure 5:
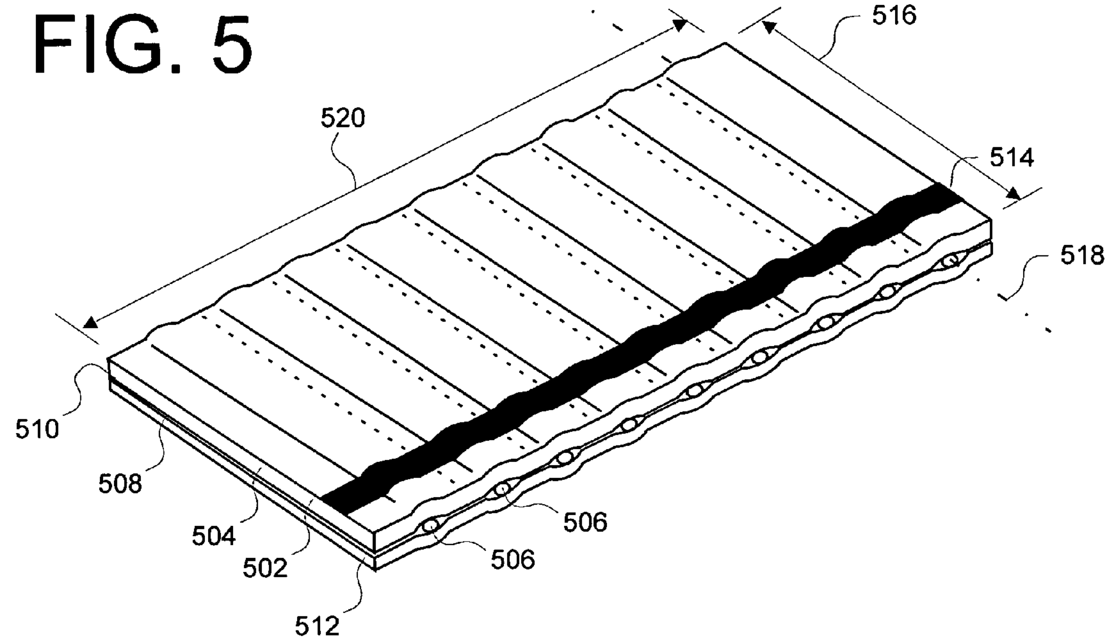
FIG. 5 illustrates an external malleable stay in wrap form according to the present invention, prior to application of the stay to a cable.

Although the implementations shown in FIGS. 3 and 4 show the stay being internal to the cable, external stays may be utilized to allow stays to be added to cables that a user already has. As shown in FIG. 5, an external malleable stay 502 in a wrap form may be formed from a web 504 having one or more malleable strips 506 bonded to a flexible sheet 508, embedded within a flexible sheet 508, or placed between flexible sheets. As shown in FIG. 5, a plurality of strips 506 may be placed between an inner 510 and an outer 512 flexible sheet. The flexible sheets may be formed from a plastic material having sufficient flexibility to allow deformation of the plastic sheets as the stay is wrapped around an end of a portion of a cable, or as the end of a cable to which the stay has been attached is wound around a coiled or bundled portion of the cable. A pressure sensitive adhesive strip 514 may be applied to one end of the wrap style stay to allow the wrap style stay to be joined or bonded to itself around a cable, around a portion of the cable, or a combination of both dependant upon the width of the wrap style stay relative to the circumference of the cable around which the wrap style stay is being wrapped.

Alternately, the adhesive 514 may be provided with a release strip (not shown) which exposes the adhesive only after the release strip has been removed from the wrap style stay. Defining the length 516 of the stay to be along the axis 518 along which the malleable strips 506 extend, and the normal to this to be the width 520, it can be seen that wrap-style stays of a considerably greater width than needed to provide a stay for a single cord may be formed. Such a stay having a width greater than needed may be provided with features allowing a portion of the wrap style stay to be readily separated from the remaining portion of the wrap style stay to allow a user to form a wrap style stay having an appropriate width. This may be accomplished by proving the wrap style stay with periodic lines of perforation 522 parallel to the malleable strips, such that a user can easily tear along the line of perforations to form the wrap style stay of an appropriate width. Alternately, a wrap style stay of greater width than needed may be packaged such that the packaging provides a convenient means for cutting the wrap style stay to an appropriate width, such as by packaging the wrap style stay in roll form within a box, wherein the box has an opening through which the wrap style stay may be withdrawn, the opening further having an edge provided with a cutter which allows the wrap style stay to be pulled against the cutter to form a wrap style stay of an appropriate width.

Figure 6:
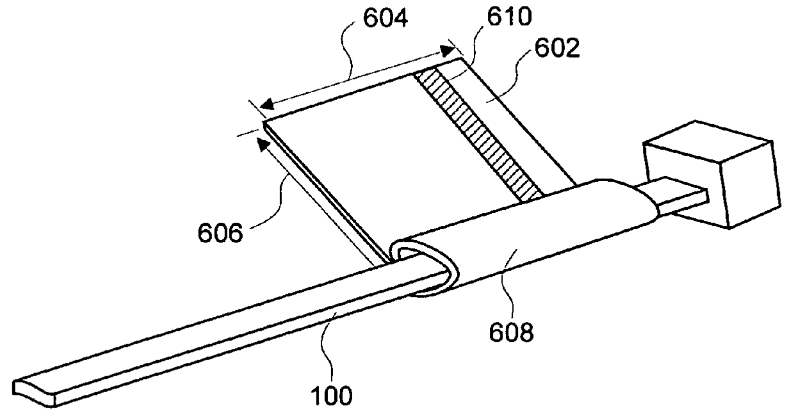
FIG. 6 illustrates an external malleable stay in wrap form partially installed onto a cable.

As shown in FIG. 6, a section of the flexible wrap style stay 602 having an appropriate length 604 and width 606 may be wrapped around a section of cable 100 to form a stay 608 at the portion of cable 100 around which the wrap style stay 602 has been wrapped. The use of a single strip of adhesive 610 allows the remaining length of the wrap style stay 602 to slide relative to the underlying cable 100, such that winding the portion of the cable 100 to which the wrap style stay has been applied around a coil or bundle will not create adverse stresses between the wrap style stay 602 and the cable 100.

Although the wrap style stay 602 is shown using a pre-applied line of adhesive, other methods of joining or bonding the wrap style stay to the cable 100 may be incorporated. For example, the wrap style stay 602 may use an external clamp to retain the wrap style stay 602 around the cable, such as a piece of tape, wire wrap, or other fastener. Alternately, the stay may be retained by an adhesive strip along one edge of the sheet stay which is parallel to the cable length.

Figure 7:
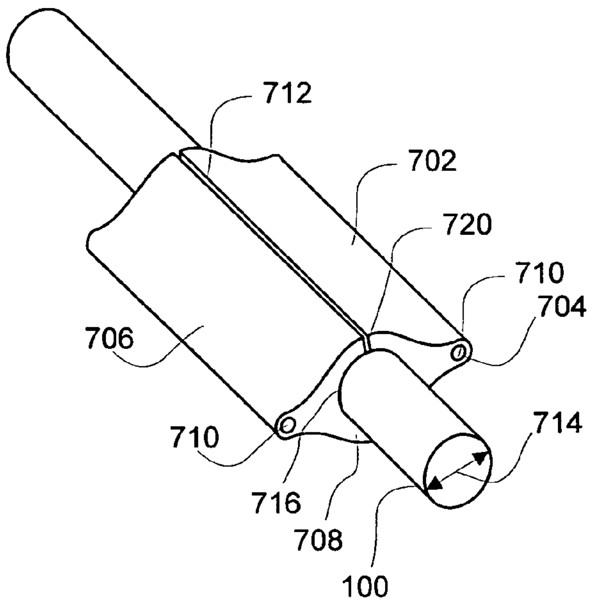
FIG. 7 illustrates a cable cover including two malleable wires inset into the cable cover, with the cable cover installed over a cable.

As shown in FIG. 7, a stay 702 using malleable strips 704 may alternately be formed as a cable cover 706. As shown, a cable cover body 708 may be formed from a flexible material. The cable cover body 708 may be provided with one or more malleable elements 710 to allow the stay 702 to be retained in position once an end of a cable has been wound around a coil or bundle. The stay body 708 may additionally be provided with a longitudinal slit 712 allowing a cable 100 to be passed into a cavity running the length of the cable cover 706.

The effectiveness of a cable cover 706 stay may be dependant upon the outer diameter of the cable 100 being slightly larger that the inner diameter of the stay body when no clamp is provided to limit motion of the cable cover relative to the cables. If the cable has a slightly larger outer diameter 714 then the inner diameter 716 of the stay body 708, the inner diameter 716 may be allowed to expand as required by forming a gap 720 along the slit 712, thus retaining the stay body 708 around the cable 100, without requiring tight tolerances with respect to the outer diameter 714 of the cable versus the inner diameter 716 of the stay body 708.

Figure 8:
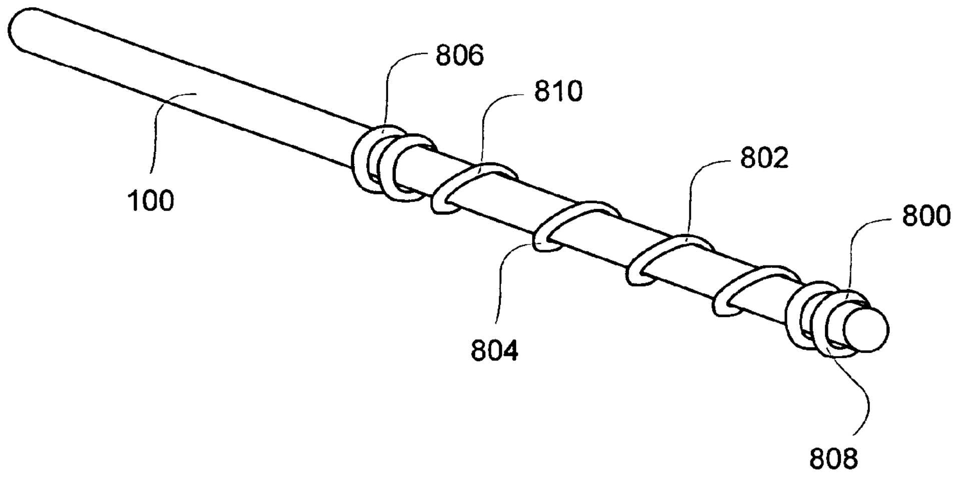
FIG. 8 illustrates a malleable wire stay applied on a helical fashion to a cable.

As shown in FIG. 8, a simple form of a stay 800 according to the present invention may be created by wrapping a malleable element 802 around an end of a cable 100, such that the stay provides the necessary stiffness to allow a cable end wrapped around a coil or bundle to be held in the wrapped position. The stay 800 may use a middle portion 804 from which the spinal windings are formed, as well as first 806 and second 808 ends which may be wound close together to fix the position of the stay 800 relative to the cable 100. A plurality of windings of the stay 800 may be used adjacent to the ends of the stay, to assist in retention of the stay ends adjacent to the positions on the cable 100 at which the ends are desired to remain fixed. The use of spiral windings 810 along the length of the portion of the cable 100 to which the stay has been applied allows the windings to adjust as necessary as the cable bends to form any wrappings. The spiral malleable stay may additionally be overwrapped with a flexible material (not shown), such as electrical tape, to retain the spiral malleable stay in its position.

Figure 9:
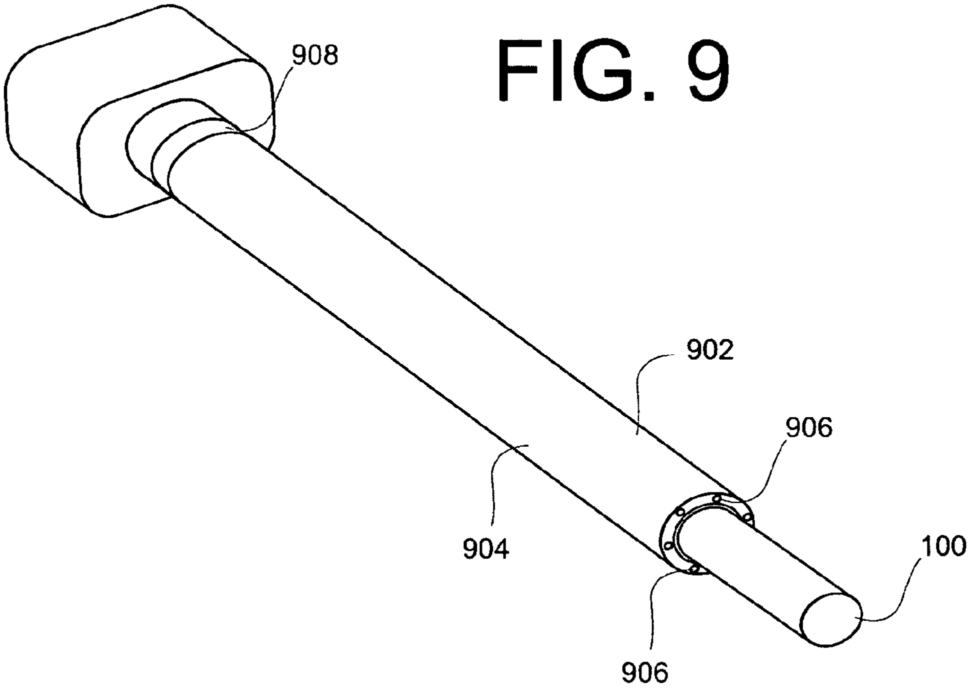
FIG. 9 illustrates a cable cover form of stay using a clamp to retain the cover adjacent to the end of a cable.

As shown in FIG. 9, a stay 902 may be formed as a cover 904 without a slit into an inner cavity, using multiple malleable wires 906 to provide the position retention capability. A clamp 908 formed from a piece of tape, cable tie, or other structure may be included to prevent the cover 904 from sliding relative to the cable 100 around which the cover has been placed.

Figure 10:
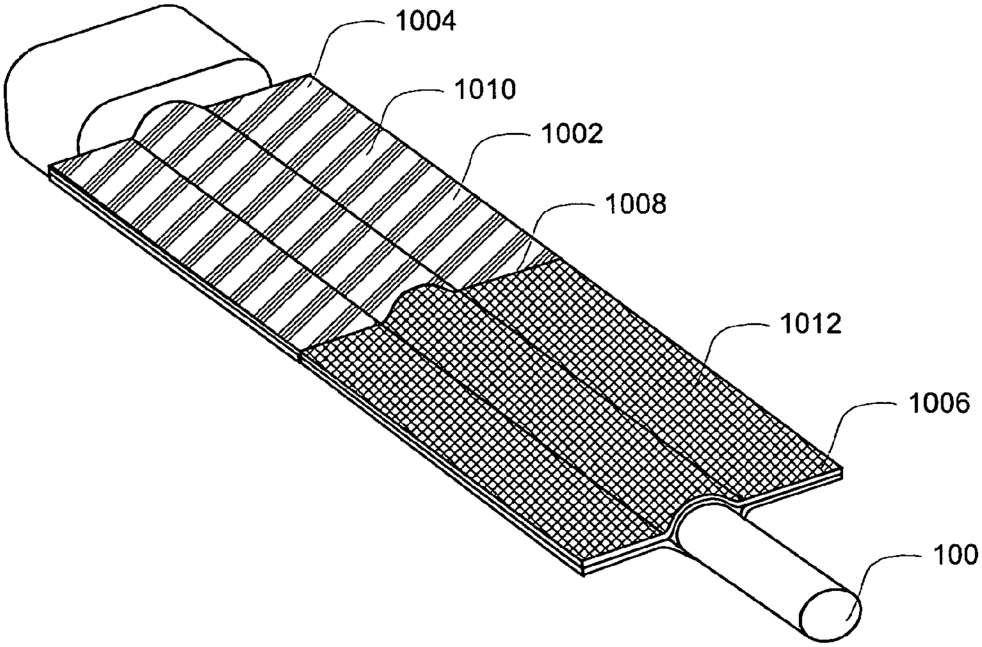
FIG. 10 illustrates a hook and loop style cable stay according to the present invention.

As shown in FIG. 10, a stay 1002 may alternately be formed using a hook and pile type fastening system commonly called by its trademark "Velcro", such that successive windings of the cable may be joined to each other to prevent the windings from unwinding when wound around a cable bundle or coil. The stay 1002 may have a first end 1004 and a second end 1006 and a midpoint 1008 between the first 1004 and second 1006 ends. A surface 1010 may be formed between the first endpoint and the midpoint having one half of a hook and pile fastener, with a second surface 1012 formed between the midpoint 1008 and a second end 1006 having the mating half of the fastener. The stay 1002 may be formed by placing alternating sections of hook and pile material onto two backings, and then joining the backings on opposite sides of the cable 100, such as by sewing the backings together, or adhering the backings together. Preferable, the backing pieces may be joined together tightly enough that the assembled stay 1002 does not readily slip relative to the cable 100. Alternately, a clamp such as a piece of tape wrapped around the cover or a wire tie may be used to create a sufficient interference between the cover and the cable to prevent the cover from readily sliding relative to the cable. The formation of the hook and pile fasteners into a cover running parallel to the long axis of the cable provides the benefit that the cover is less likely to become entangled when attached to the cable than a retainer, such as an attached strap extending outwardly from the cable would do.

The present invention may be embodied in other specific forms than the embodiments described above without departing from the spirit or essential attributes of the invention. Accordingly, reference should be made to the appended claims, rather than the foregoing specification, as indicating the scope of the invention.

What is claimed is:

1. A self-retaining cable, said cable comprising:

A flexible cable, said cable having a length, a central axis, said central axis following a centroid of said cable along the length of said cable, and a first end and a second end;

At least one cable stay, said cable stay located adjacent said first end of said cable and extending along a portion of said cable for a length, said length selected to allow said first end of said cable to be wound around one or more bights of said cable when said cable is in a wound or bundled condition, said cable stay selectively retaining said first end of said cable in said wrapped condition when said first end of said cable is wrapped around said cable is in a coiled or bundled condition;

wherein said stay comprises a malleable element having a first end and a second end and a length, wherein said first end of said malleable element is affixed to said first end of said cable, and wherein said malleable element is retained substantially parallel to said cable central axis;

wherein said cable has an outer sheath and a central cavity formed within said outer sheath, and wherein said malleable element is located within said cavity.

2. A self retaining cable according to claim 1, wherein said malleable element has a core element and an outer cover, and wherein at least a portion of said core element is slidable relative to said outer cover.

3. A self-retaining cable, said cable comprising:

A flexible cable, said cable having a length, a central axis, said central axis following a centroid of said cable along the length of said cable, and a first end and a second end;

At least one cable stay, said cable stay located adjacent said first end of said cable and extending along a portion of said cable for a length, said length selected to allow said first end of said cable to be wound around one or more bights of said cable when said cable is in a wound or bundled condition, said cable stay selectively retaining said first end of said cable in said wrapped condition when said first end of said cable is wrapped around said cable in a coiled or bundled condition:

wherein said stay comprises a resilient helical form, said resilient helical form having a first form end and a second form end, said resilient helical form being affixed to said cable adjacent a first end of said cable, said cable extending along a path defined by said helical form for a portion of the length of said cable; and wherein said cable has an outer sheath and a cavity within said outer sheath, and wherein said helical form is disposed within said cavity.

4. A cable stay comprising a web and a plurality of malleable wire elements, said web having a first end, a second end, an inner surface and an outer surface, a length and a width, said length extending from said first web end to said second web end, said wire elements being oriented substantially parallel to said length of said web, said cable stay further comprising an adhesive disposed on said inner surface of said web adjacent said first end, wherein said stay may be wrapped around an outer surface of a first end of a cable with said adhesive retaining said stay around said cable, and wherein said malleable wire elements allow said first end of said cable to be retained in a wrapped condition when said first end of said cable is wrapped around one or more bights of said cable;

further comprising a plurality of lines of perforation extending substantially parallel to said length of said web, said perforations allowing a desired width of said web to be obtained by tearing said web along a line of perforation.

* * * * *